(12) United States Patent
Doan et al.

(10) Patent No.: US 6,559,030 B1
(45) Date of Patent: May 6, 2003

(54) METHOD OF FORMING A RECESSED POLYSILICON FILLED TRENCH

(75) Inventors: Thai Doan, Burlington, VT (US); Zhong-Xiang He, Essex Junction, VT (US); Michael P. McMahon, Holden, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/015,987

(22) Filed: Dec. 13, 2001

(51) Int. Cl.[7] ............................................. H01L 21/76
(52) U.S. Cl. .................... 438/432; 438/430; 438/431; 438/453; 438/597; 438/697; 438/700
(58) Field of Search ................. 438/424, 427, 438/429, 430, 431, 432, 453, 692, 694, 695, 697, 700, 597; 257/505, 513

(56) References Cited

U.S. PATENT DOCUMENTS

| | | | |
|---|---|---|---|
| 4,965,217 A | * 10/1990 | Desilets et al. ............. | 438/337 |
| 5,264,381 A | * 11/1993 | Harada ....................... | 438/137 |
| 5,382,795 A | 1/1995 | Bayer et al. | |
| 5,451,809 A | 9/1995 | Shiozawa et al. | |
| 5,753,947 A | 5/1998 | Gonzalez | |
| 5,824,580 A | * 10/1998 | Hauf et al. .................. | 438/243 |
| 5,888,876 A | 3/1999 | Shiozawa et al. | |
| 6,022,789 A | * 2/2000 | Takase ......................... | 438/431 |
| 6,066,566 A | * 5/2000 | Naeem et al. .............. | 438/700 |
| 6,261,966 B1 | * 7/2001 | Li et al. ...................... | 438/706 |
| 6,326,293 B1 | * 12/2001 | Fang et al. .................. | 438/597 |
| 6,399,976 B1 | * 6/2002 | Geis et al. ................... | 257/301 |

OTHER PUBLICATIONS

IBM Technical Disclosure Bulleting "Methos of Preventing Excessive Oxidation of Polysilicon Trench Fill in Semiconductor Devices", Mar. 1988, vol. 30, pp. 156–158.*

IBM Technical Disclosure Bulleting "Trench–Isolation Structure", May 1985, vol. 27, pp. 6981–6982.*

* cited by examiner

Primary Examiner—Amir Zarabian
Assistant Examiner—Maria Guerrero
(74) Attorney, Agent, or Firm—Schmeiser, Olsen & Watts; William D. Sabo

(57) ABSTRACT

A method of forming a recessed polysilicon contact is provided. The method includes: forming a trench in a substrate; overfilling the trench with polysilicon; removing the polysilicon outside of the trench to provide a substantially planar surface; oxidizing the surface of the polysilicon in the trench using plasma oxidation; and removing an upper portion of the polysilicon from the trench.

14 Claims, 6 Drawing Sheets

US 6,559,030 B1

METHOD OF FORMING A RECESSED POLYSILICON FILLED TRENCH

FIELD OF THE INVENTION

The present invention relates to the field of semiconductor fabrication; more specifically, it relates to a method for forming recessed polysilicon contacts in semiconductor devices.

BACKGROUND OF THE INVENTION

During manufacture of semiconductor chips, transistors, diodes, capacitors and resistors along with other devices formed in the silicon portion of the chip must be interconnected to one another to form circuits. Modern semiconductor chips utilize planer technology for these interconnections. In planer interconnect technology, an insulating layer is formed on the chips surface, a trench is formed in the insulator, filled with conductor and the insulator and conductor co-planarized flat. This may be repeated many times to build up the necessary level of device interconnections required in a modern semiconductor chip.

In certain cases, it is desirable for the conductive wires to be formed from materials that are detrimental to the active devices. In these cases, the trench is filled with polysilicon. Filling the trench with polysilicon can lead to high contact resistance. Therefore recessed polysilicon contact technology has been developed. In recessed polysilicon technology the upper portion of the polysilicon is removed from the trench before the conductive wires are formed. However, as the depth to width aspect ratio of polysilicon contacts has increased, mainly due to increasing density and decreasing contact widths, several types of defects have occurred which can cause yield and reliability failures.

The first defect type is a void in the polysilicon. Voids may reach so deep into the recessed polysilicon contact that the conductive wire may contact the active device directly or they may simply increase the resistance of the contact because there is less material. Another type of defect is a polysilicon spike. Spikes are regions of polysilicon reaching up into the conductive wire and can increase the resistance of the contact.

Thus, there is a need for a method of forming recessed polysilicon contacts in which void and spike defects are greatly reduced or eliminated.

SUMMARY OF THE INVENTION

A first aspect of the present invention is a method of forming a recessed polysilicon contact, comprising: forming a trench in a substrate; overfilling the trench with polysilicon; removing the polysilicon outside of the trench to provide a substantially planar surface; oxidizing the surface of the polysilicon in the trench using plasma oxidation; and removing an upper portion of the polysilicon from the trench.

A second aspect of the present invention is a method of forming a recessed polysilicon contact, comprising: forming a trench in an insulating layer down to a conductive layer; overfilling the trench with polysilicon; removing the polysilicon outside of the trench to form a polysilicon contact in the trench to the conductive layer, a top surface of the polysilicon contact co-planer with a top surface of the insulating layer; oxidizing the a top surface of the polysilicon contact using plasma oxidation; and removing an upper portion of the polysilicon contact from the trench to form the recessed polysilicon contact to the conductive layer.

A third aspect of the present invention is a recessed polysilicon contact prepared by the process comprising: forming a trench in a substrate; overfilling the trench with polysilicon; removing the polysilicon outside of the trench to provide a substantially planar surface; oxidizing the surface of the polysilicon in the trench using plasma oxidation; and removing an upper portion of the polysilicon from the trench.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
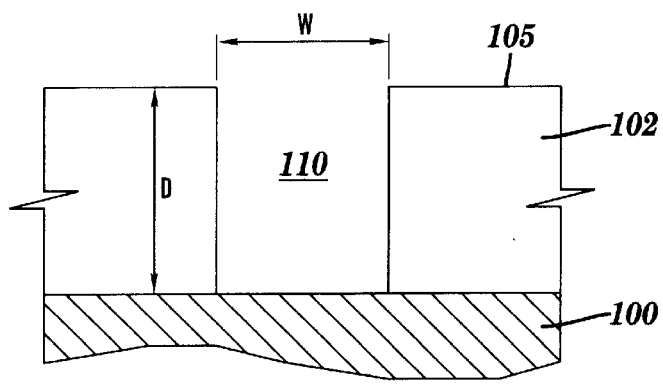
FIGS. 1 through 3 are partial cross-sectional views illustrating the initial steps for fabricating a recessed polysilicon contact that will result in void or spike and void defects in the completed contact.
Figure 2:
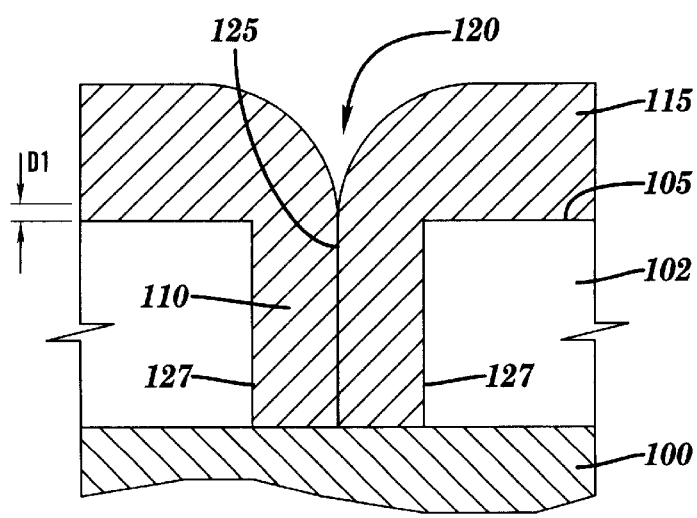
Figure 3:
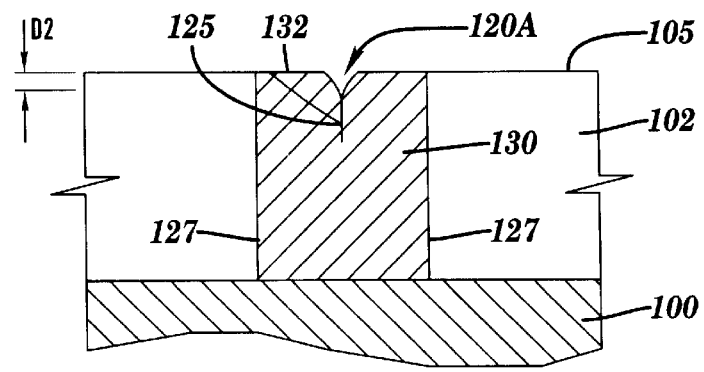

FIGS. 1 through 3 are partial cross-sectional views illustrating the initial steps of fabricating a recessed polysilicon contact that will result in void or spike and void defects in the completed contact. In FIG. 1, formed on a conductor 100 is an insulating layer 102 having a top surface 105. In one example, insulating layer 102 is silicon dioxide, silicon nitride, tetraethoxysilane (TEOS) oxide or high-density plasma (HDP) oxide and conductive layer 100 is doped (diffused) silicon or polysilicon. From top surface 105 a trench 110 has been formed by well known photolithographic and RIE methods, and extends a distance "D" into insulating layer 100. Trench 110 has a width "W." In one example, "D" is about 0.5 microns or more and "W" is 0.25 microns or less.

In FIG. 2, a polysilicon layer 115 of sufficient thickness to fill trench 110 is deposited by well-known chemical vapor deposition (CVD) or low-pressure vapor deposition (LPCVD) or plasma enhanced chemical vapor deposition (PECVD) methods. Attributes of the polysilicon fill process include formation of a dip 120 and a seam 125 in polysilicon layer 115. Dip 120 is caused by the presence of trench 110. Seam 125 is formed when polysilicon depositing on sidewalls 127 of trench 110 reach a sufficient thickness to meet in the approximate middle of the width of the trench. Dip 120 does not extend into now filled trench 110 and ends a distance "D1" above surface 105 of insulating layer 100. However, under certain circumstances (such as a thinner than required polysilicon layer 110), dip 120 may extend into trench 110 and larger defects may be expected. On the other hand, seam 125 does extend into trench 110. In one example, for a trench having a depth of 0.5 to 1.0 microns polysilicon layer 115 is about 2000 to 4500 Å thick and "D1" is about 1000 to 4500 Å.

Figure 4:
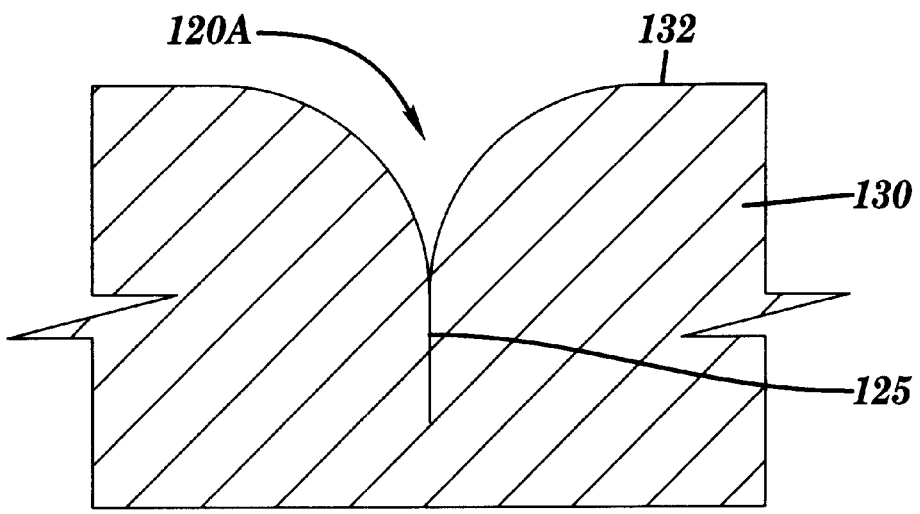
FIG. 4 is a blow up view of the central portion of the polysilicon filled trench of FIG. 3 after planarization by a reactive ion etch (RIE) process.
Figure 5:
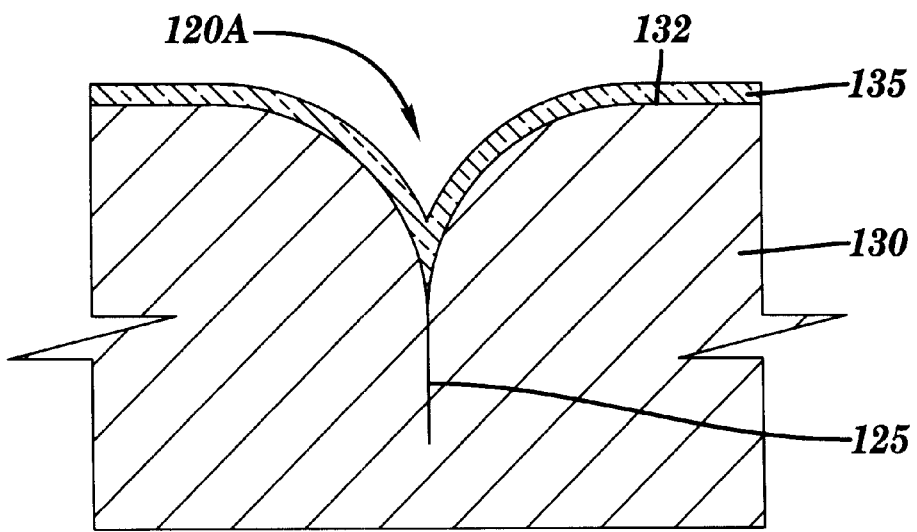
FIG. 5 is a blow up view of the central portion of the polysilicon filled trench of FIG. 3 after planarization by a chemical-mechanical-polish (CMP) process.

In FIG. 3, a planarization process is performed, removing excess polysilicon from top surface 105 of insulating layer 100 and forming polysilicon contact 130 to conductive layer 100. A top surface 132 of polysilicon contact 130 is coplanar with top surface 105 of insulating layer 102 except in a dip 120A. Dip 120A is a replication by the planarization process of dip 120 illustrated in FIG. 2 and described above. Dip 120A extends a distance "D2" into polysilicon contact 130. In one example, "D2" is about 200 to 800 Å. There are two well-known planarization methods and while FIG. 3 accurately illustrates the gross structure of polysilicon contact formed by either method. FIGS. 4 and 5 provide additional detail.

FIG. 4 is a blow up view of the central portion of the polysilicon filled trench of FIG. 3 after planarization by an RIE planarization process. An RIE planarization process removes material equally from all exposed surfaces. The RIE planarization process is designed to be selective to polysilicon over the insulating material of insulating layer 102. The RIE planarization process removes material by both mechanical means (ion bombardment dislodging atoms from the surface of the material being etched) and chemical means (conversion of atoms on the surface into a readily vaporizable compound). In a polysilicon RIE planarization process, any thin oxides that may be present on surface 132 of polysilicon contact 130 are removed or prevented from forming.

FIG. 5 is a blow up view of the central portion of the polysilicon filled trench of FIG. 3 after planarization by a CMP process. A CMP process utilizes slurries to remove material by mechanical abrasion of particles from the surface of the material being polished and then chemically dissolving the particles. The surface is also smoothed by direct chemical reaction dissolving the material. Polysilicon CMP slurries chemically oxidize silicon. Therefore, a main difference between RIE planarization and CMP planarization of polysilicon films is the formation of a substantial $SiO_2$ film on exposed surfaces of polysilicon in the CMP process. In FIG. 5, a $SiO_2$ layer 135 is formed on top surface 132 of polysilicon contact 130. In one example, $SiO_2$ layer 135 is about 15 to 25 Å thick. In one example, CMP polishing slurry comprises silica particles suspended in a KOH solution.

Figure 6:
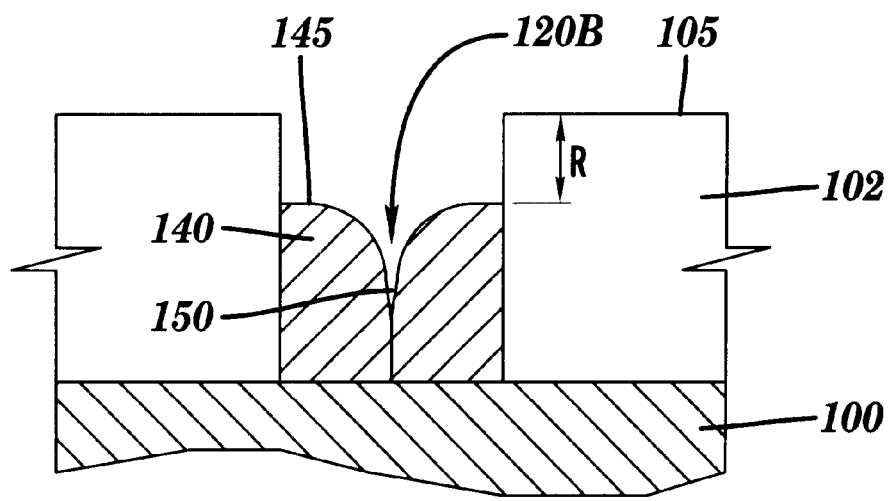
FIG. 6 is a partial cross-sectional view after recessing the polysilicon fill, when the planarization step is performed using an RIE process, illustrating a void defect.

FIG. 6 is a partial cross-sectional view after recessing the polysilicon fill, when the planarization step is performed using an RIE planarization process, illustrating a void defect. In FIG. 6, a recess RIE is performed to form recessed polysilicon contact 140. A surface 145 of recessed polysilicon contact 140 is recessed a distance "R" from top surface 105 of insulating layer 102. In one example, "R" is about 0.15 to 0.45 microns. In one example, the RIE recess etch process uses a flow of about 10 to 40 sccm of $SF_6$ at a pressure of about 3 to 20 millitorr and a forward power of about 80–200 watts. A dip 120B is present is surface 145 and is a replication of dip 120A illustrated in FIG. 3. Also, at least a portion of seam 125 (see FIG. 3) is opened up into a void 150 during the RIE recess etch process.

Figure 7:
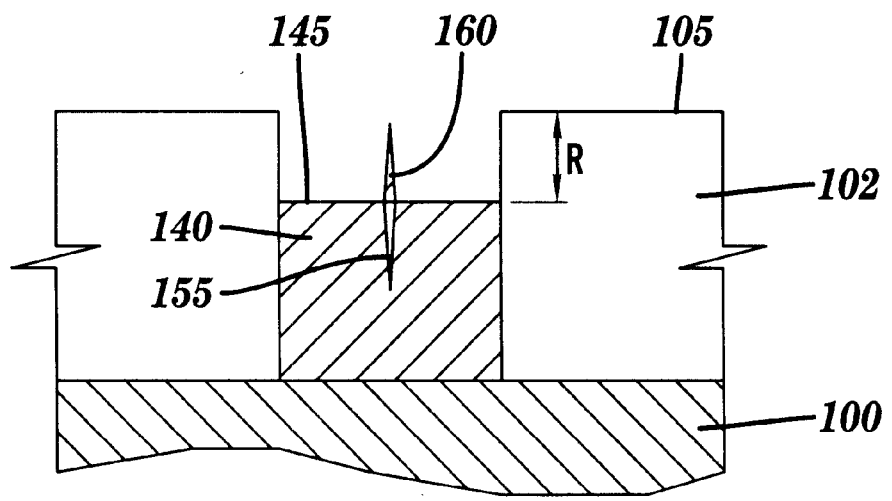
FIG. 7 is a partial cross-sectional view after recessing the polysilicon fill, when the planarization is performed using a CMP process, illustrating a spike and void defect.

FIG. 7 is a partial cross-sectional view after recessing the polysilicon fill when the planarization step is performed using a CMP planarization process illustrating a spike and void defect. In FIG. 7, an RIE recess is performed to form recessed polysilicon contact 140. A surface 145 of recessed polysilicon contact 140 is recessed a distance "R" from top surface 105 of insulating layer 102. In one example, "R" is about 0.15 to 0.45 microns. In one example, the RIE recess etch process uses a flow of about 10 to 40 sccm of $SF_6$ at a pressure of about 3 to 20 millitorr and a forward power of about 80 to 200 watts. A polysilicon spike 160 is present on surface 145 in the location corresponding to dip 120A illustrated in FIG. 3. Polysilicon spike 160 is primarily caused by $SiO_2$ layer 135 illustrated in FIG. 5. Also, at least a portion of seam 125 (see FIG. 3) is opened up into a void 155 during the RIE recess etch process.

Figure 8:
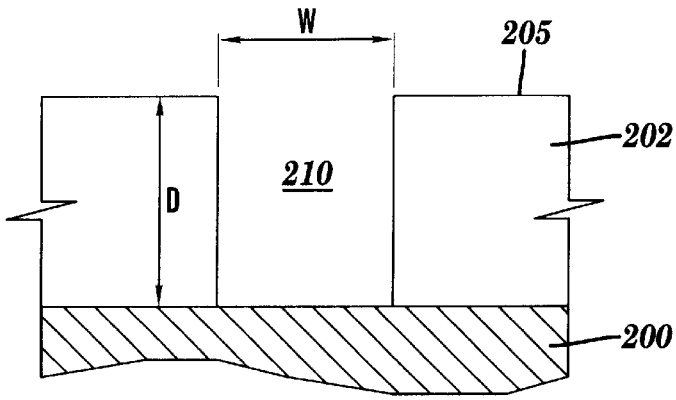
FIGS. 8 through 13 are partial cross-sectional views illustrating the fabrication of a recessed polysilicon contact according to the present invention.

FIGS. 8 through 12 are partial cross-sectional views illustrating the fabrication of a recessed polysilicon contact according to the present invention. The processes steps illustrated in FIGS. 8 through 10 and described below are essentially the same as those illustrated in FIGS. 1 through 3 and described above. In FIG. 8, formed on a conductor 200 is an insulating layer 202 having a top surface 205. In one example, insulating layer 202 is silicon dioxide, silicon nitride, TEOS oxide or HDP oxide and conductive layer 200 is doped (diffused) silicon or polysilicon. From top surface 205 a trench 210 has been formed by well known photolithographic and RIE methods, a distance "D" into insulating layer 202. Trench 210 has a width "W." In one example, "D" is about 0.5 microns or more and "W" is 0.25 microns or less.

Figure 9:
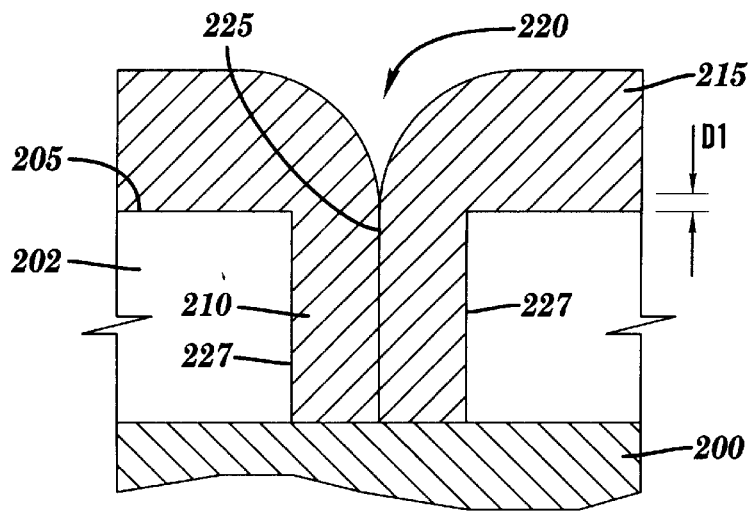

In FIG. 9, a polysilicon layer 215 of sufficient thickness to fill trench 210 is deposited by well known CVD, LPCVD or PECVD methods. Attributes of the polysilicon fill process include formation of a dip 220 and a seam 225 in polysilicon layer 215. Dip 220 is caused by the presence of trench 210. Seam 225 is formed when polysilicon depositing on sidewalls 227 of trench 210 reach a sufficient thickness to meet in the approximate middle of the trench. Dip 220 does not extend into now filled trench 210 and ends a distance "D1" above surface 205 of insulating layer 200. Seam 225 extends into trench 210. In one example, for a trench having a depth of 0.5 to 1.0 microns, polysilicon layer 215 is about 2000 to 4500 Å thick, and "D1" is about 1000 to 2500 Å.

Figure 10:
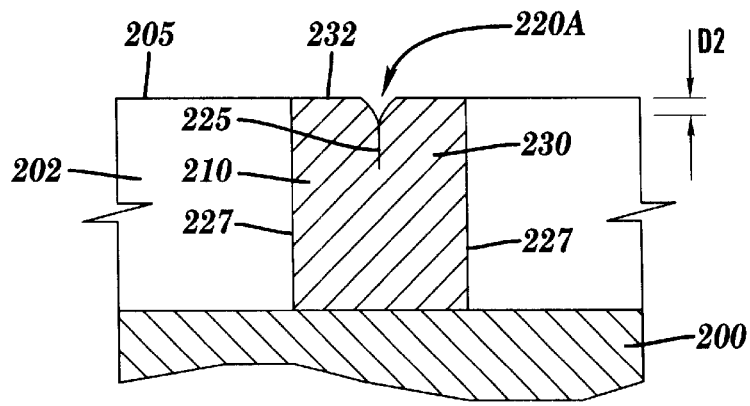

In FIG. 10, a polysilicon RIE planarization process is performed, removing excess polysilicon from top surface 205 of insulating layer 202 and forming polysilicon contact 230 to conductive layer 200. A top surface 232 of polysilicon contact 230 is coplanar with top surface 205 of insulating layer 202 except in a dip 220A. Dip 220A is a replication of dip 220 illustrated in FIG. 9 and described above. Dip 220A extends a distance "D2" into polysilicon contact 230. In one example, "D2" is about 200 to 800 Å. The polysilicon RIE planarization process removes any thin oxides that may be present on surface 232 of polysilicon contact 230 and prevents oxide layers from forming. In one example, the polysilicon RIE planarization process uses a flow of about "20 to 100 sccm of $SF_6$ at a pressure of about 3 to 20" millitorr and a forward power of about 400 to 800 watts and is performed in an AMT 5200 DPS (decoupled plasma system) manufactured by Applied Materials Corp. of Santa Clara, Calif.

Figure 11:
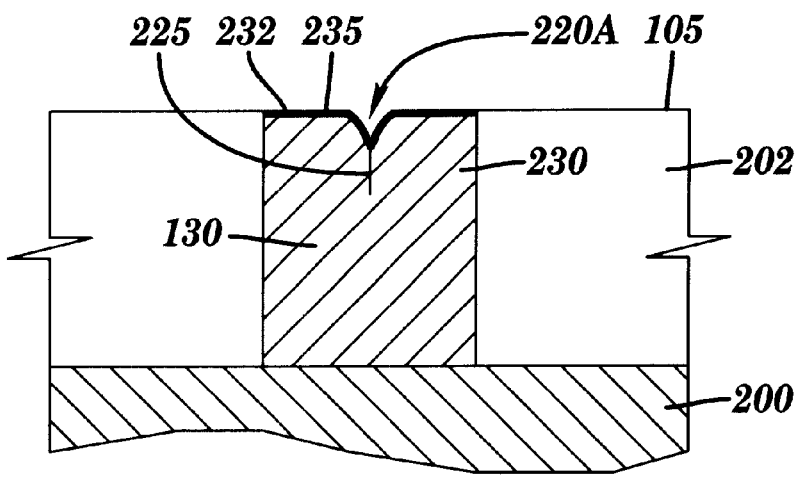

In FIG. 11, a plasma oxidation process is performed to oxidize top surface 235 of polysilicon contact 230. The plasma oxidation process converts a portion of top surface 232 of polysilicon contact 230 into an ultra-thin $SiO_x$ layer 235. In one example, the plasma oxidation process uses a flow of about 5 to 20 sccm of $O_2$ at a pressure of about 3 to 20 millitorr and a forward power of about 80 to 200 watts for about 2 to 8 seconds and is performed in a AMAT 5200 DPS tool manufactured by Applied Materials, Santa Clara. Ultra-thin $SiO_x$ layer 235 is illustrated in FIG. 12 and discussed below.

Figure 12:
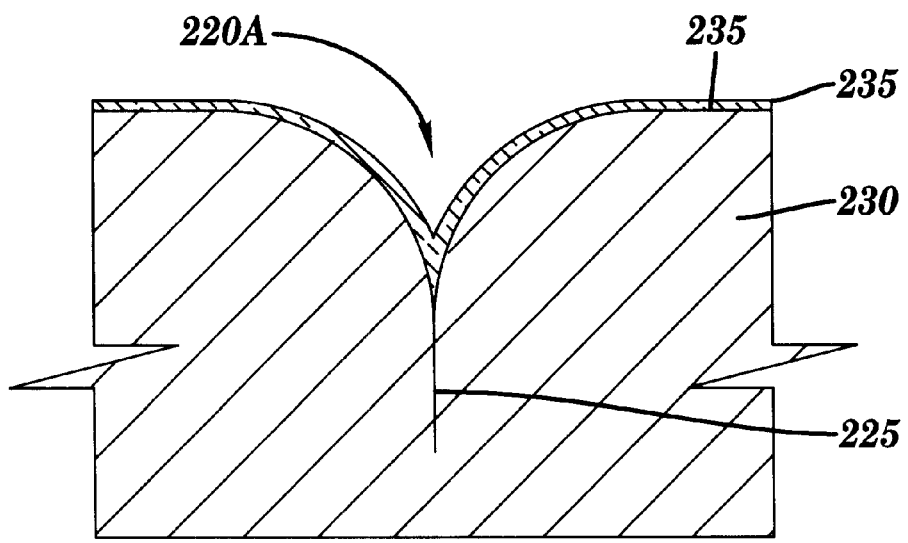

FIG. 12 is a blow up view of the central portion of the polysilicon fill of FIG. 11, after plasma oxidation. In FIG. 12, ultra-thin $SiO_x$ layer 235 is formed in top surface 232 of polysilicon contact 230. In one example, ultra thin $SiO_x$ layer 235 is about 3 to 10 Å thick. In a second example, ultra thin $SiO_x$ layer 235 is about 1 to 3 $SiO_x$ monolayers thick.

Figure 13:
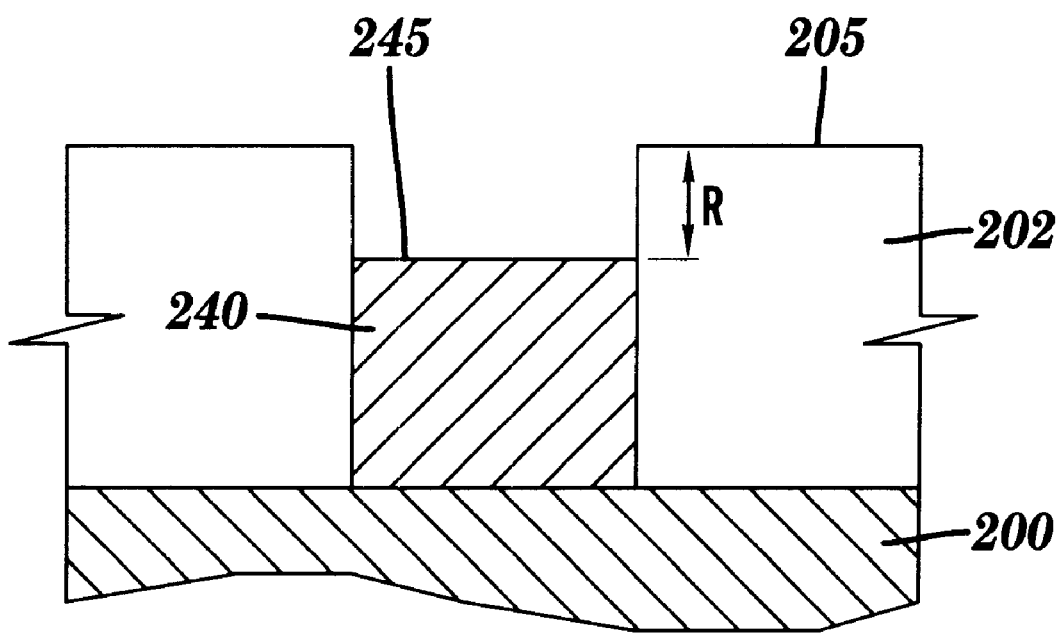

In FIG. 13, a recess RIE is performed to form recessed polysilicon contact 240. A top surface 245 of recessed polysilicon contact 240 is recessed a distance "R" from top surface 205 of insulating layer 200. Top surface 245 of recessed polysilicon contact 240 is substantially flat. In one example, "R" is about 0.15 to 0.45 microns. In one example, the RIE recess etch process uses a flow of about 1 to 40 sccm of $SF_6$ at a pressure of about 3 to 20 millitorr and a forward power of about 80 to 200 watts and is performed in an AMAT 5200 DPS manufactured by Applied Materials Corp of Santa Clara, Calif. Note the absence of a dip, void or spike in recessed polysilicon contact 230. This is a relatively unexpected result and is due to the plasma oxidation process illustrated in FIG. 11 and described above. That this result is unexpected is supported by the fact that the $SiO_2$ layer of about 15 to 20 Å formed by CMP planarization caused significant defect formation, namely spikes while the ultra-thin $SiO_x$ layer formed by the plasma oxidation step does not cause void or spike defect formation.

A conductive layer such as aluminum, copper, tungsten, titanium, tantalum, titanium nitride, tantalum nitride or combinations thereof may now be used to fill the remaining space of the trench and provide interconnection to other portions of the semiconductor device.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming a recessed polysilicon contact, comprising the steps of:
    (a) forming a trench in a substrate having an insulating layer;
    (b) overfilling said trench with polysilicon;
    (c) removing said polysilicon outside of said trench to provide a substantially planar surface;
    (d) oxidizing the surface of said polysilicon in said trench using plasma oxidation to form a silicon oxide layer; and
    (e) removing said silicon oxide layer and an upper portion of said polysilicon from said trench.

2. The method of claim 1, wherein said surface of said polysilicon is oxidized to a thickness of 3 to 10 Å.

3. The method of claim 1, wherein step (d) forms a thickness of 3 to 10 Å of $SiO_x$.

4. The method of claim 1, wherein step (d) forms 1 to 3 monolayers of $SiO_x$.

5. The method claim 1, wherein a top surface of said polysilicon after step (e) is substantially flat.

6. The method of claim 1, wherein step (c) comprises a planarizing using a reactive ion etch planarization processes.

7. A method of forming a recessed polysilicon contact, comprising the steps of:
    (a) forming a trench in an insulating layer down to a conductive layer;
    (b) overfilling said trench with polysilicon;
    (c) removing said polysilicon outside of said trench to form a polysilicon contact in said trench to said conductive layer, wherein a top surface of said polysilicon contact is co-planer with a top surface of said insulating layer;
    (d) oxidizing the top surface of said polysilicon contact using plasma oxidation to form a silicon oxide layer; and
    (e) removing said silicon oxide layer and an upper portion of said polysilicon contact from said trench to form said recessed polysilicon contact to said conductive layer.

8. The method of claim 7, wherein said surface of said polysilicon is oxidized to a thickness of 3 to 10 Å.

9. The method of claim 7, wherein step (d) forms a thickness of 3 to 10 Å of $SiO_x$.

10. The method of claim 7, wherein step (d) forms 1 to 3 monolayers of $SiO_x$.

11. The method claim 7, wherein a top surface of said recessed polysilicon contact after step (e) is substantially flat.

12. The method of claim 7, wherein step (c) comprises a planarizing using a reactive ion etch planarization processes.

13. The method of claim 7, wherein said trench has a width of 0.25 microns or less and a depth of 0.5 microns or more.

14. The method of claim 7, wherein the plasma oxidation of step (d) uses a flow of 5 to 20 sccm of $O_2$ at a pressure of 3 to 20 millitorr and a forward power of 80 to 200 watts for 2 to 8 seconds.

* * * * *